(12) United States Patent
Liu (10) Patent No.: US 12,517,533 B2
(45) Date of Patent: Jan. 6, 2026

(54) DYNAMIC BIAS VOLTAGE CIRCUIT AND INTEGRATED CIRCUIT

(71) Applicant: MediaTek Singapore Pte. Ltd., Singapore (SG)

(72) Inventor: Mengxue Liu, Anhui (CN)

(73) Assignee: MediaTek Singapore Pte. Ltd., Singapore (SG)

( * ) Notice: Subject to any disclaimer, the term of this patent is extended or adjusted under 35 U.S.C. 154(b) by 201 days.

(21) Appl. No.: 18/368,528

(22) Filed: Sep. 14, 2023

(65) Prior Publication Data

US 2025/0068198 A1    Feb. 27, 2025

(30) Foreign Application Priority Data

Aug. 23, 2023    (CN) .......... 202311072109.1

(51) Int. Cl.
  *G05F 1/46*    (2006.01)
  *G05F 1/575*   (2006.01)
  *G05F 3/26*    (2006.01)

(52) U.S. Cl.
  CPC .............. *G05F 1/468* (2013.01); *G05F 1/575* (2013.01); *G05F 3/262* (2013.01)

(58) Field of Classification Search
  CPC .......... G05F 1/468; G05F 1/575; G05F 3/262; H03K 19/018507; H03K 19/00315
  See application file for complete search history.

(56) References Cited

U.S. PATENT DOCUMENTS

| 2005/0088199 | A1  | 4/2005  | Bales |
| 2014/0361760 | A1* | 12/2014 | Kuan ........................ G05F 1/46 323/299 |
| 2021/0409020 | A1  | 12/2021 | Singrigowda |
| 2022/0329232 | A1* | 10/2022 | Hsu ................ H03K 19/018521 |
| 2024/0385636 | A1* | 11/2024 | Samir ........................ G05F 3/16 |

\* cited by examiner

*Primary Examiner* — Alex Torres-Rivera
(74) *Attorney, Agent, or Firm* — Winston Hsu (57) ABSTRACT

A dynamic bias voltage circuit for providing a bias voltage includes: a buffer circuit, a voltage divider circuit and a voltage follower circuit. The buffer circuit is configured to output a second voltage according to a first voltage. The voltage divider circuit is coupled to the buffer circuit and configured to implement a voltage division function to provide a third voltage according to the second voltage and a pad voltage on a pad of the integrated circuit. The voltage follower circuit is coupled to the voltage divider circuit and configured to generate the bias voltage according to the third voltage.

20 Claims, 4 Drawing Sheets

DYNAMIC BIAS VOLTAGE CIRCUIT AND INTEGRATED CIRCUIT

BACKGROUND

The present invention relates to integrated circuits, and more particular to a dynamic bias voltage circuit for providing a dynamic bias voltage to specific transistors of an integrated circuit.

In applications for Universal Serial Bus (USB) 2.0, a voltage variation range on signal pads of USB integrated circuits (ICs) can be significantly varied from −0.4V to 4.03V. Considering certain semiconductor manufacturing processes, a maximum withstand voltage for gate-to-drain junctions of Metal-Oxide-Semiconductor (MOS) transistors may be small, and for example could be even limited to 1.65V (e.g. in a 3 nm process). Therefore, if a bias voltage at the gate of a MOS transistor is statically set, it might prove challenging to meet reliability requirements given the wide voltage variation range on the pads.

SUMMARY

In view of this, it is one object of the present invention to provide a dynamic bias voltage circuit that is operable to dynamically track voltage variations on IC pads. The dynamic bias voltage circuit of the present invention generates a bias voltage for first transistors seen from or directly connected with the IC pads. This ensures that the absolute value of gate-to-drain voltages of the first transistors seen from or directly connected with the pads would not exceed a maximum withstand voltage imposed by their manufacturing process, although the voltage variation range on the pads is wide.

According to some embodiments of the present invention, a dynamic bias voltage circuit for providing a bias voltage to at least one specific transistor of an integrated circuit is provided. The dynamic bias voltage circuit comprises: a buffer circuit, a voltage divider circuit and a voltage follower circuit. The buffer circuit is configured to output a second voltage according to a first voltage. The voltage divider circuit is coupled to the buffer circuit and configured to provide a third voltage according to the second voltage and a pad voltage on a pad of the integrated circuit. The voltage follower circuit is coupled to the voltage divider circuit and configured to generate the bias voltage according to the third voltage.

According to some embodiments of the present invention, the buffer circuit comprises an amplifier, which has a first input terminal, a second input terminal and an output terminal, wherein the first input terminal receives the first voltage, and the second input terminal is coupled to the output terminal. Additionally, the output terminal of the amplifier outputs the second voltage, and the second voltage equals the first voltage. Alternatively, the second voltage is generated based on the output voltage of the amplifier and the second voltage is less than the first voltage.

According to some embodiments of the present invention, the dynamic bias voltage circuit further comprises a voltage generating circuit, coupled to the buffer circuit, configured to generate the first voltage by dividing a power supply voltage through a resistor network. Additionally, the resistor network comprises a first resistor and a second resistor connected in series.

According to some embodiments of the present invention, the voltage divider circuit comprises a third resistor and a fourth resistor connected in series, wherein the third voltage is generated at a node between the third resistor and the fourth resistor.

According to some embodiments of the present invention, a first end of the third resistor is coupled to the pad voltage, a second end of the third resistor is coupled to a first end of the fourth resistor, and a second end of the fourth resistor is coupled to the second voltage.

According to some embodiments of the present invention, the resistance relationship between the third resistor and the fourth resistor is associated with a voltage variation range of the pad voltage and a maximum withstand voltage imposed by specific manufacturing process of the integrated circuit.

According to some embodiments of the present invention, the voltage follower circuit comprises a first transistor, a second transistor and a third transistor. The first transistor has a control end, a first end and a second end, wherein the control end of the first transistor is coupled to a first fixed voltage, the first end of the first transistor is coupled to a power supply voltage. The second transistor has a control end, a first end and a second end, wherein the control end of the second transistor is coupled to the third voltage, the first end of the second transistor is coupled to the second end of the first transistor, the node between the first transistor and the second transistor serves as an output terminal of the voltage follower circuit. The third transistor has a control end, a first end and a second end, wherein the control end of the third transistor is coupled to a second fixed voltage, the first end of the third transistor is coupled to the second end of the second transistor, and the second end of the third transistor is coupled to the ground.

According to some embodiments of the present invention, the voltage follower circuit comprises a source follower, which is implemented by a transistor.

According to some embodiments of the present invention, the dynamic bias voltage circuit further comprises a current mirror circuit, configured to provide an operating current for the voltage follower circuit.

According to some embodiments of the present invention, the bias voltage is associated with the pad voltage and the operating current.

According to some embodiments of the present invention, the integrated circuit comprises a normal operating mode and a power-saving mode; during the normal operating mode, the operating current has a first current value, and during the power-saving mode, the operating current has a second current value which is less than the first current value.

According to some embodiments of the present invention, the integrated circuit is compliant with Universal Serial Bus (USB) standard, and the integrated circuit comprises a full-speed transmission (FSTX) mode and a power-saving mode, during the FSTX mode, the operating current has a first current value, and during the power-saving mode, the operating current has a second current value which is less than the first current value.

According to some embodiments of the present invention, the at least one specific transistor to which the bias voltage is provided is at least one of first transistors seen from or directly connected to the pad of the integrated circuit and the bias voltage is coupled to a control end of the at least one specific transistor.

According to some embodiments of the present invention, an integrated circuit is provided. The integrated circuit comprises: an output stage circuit and a dynamic bias voltage circuit. The output stage circuit is configured to communicate signals to structures external to the integrated circuit. The dynamic bias voltage circuit is configured to provide a dynamic bias voltage to at least one specific transistor of the output stage circuit. The dynamic bias voltage circuit comprises: a buffer circuit, a voltage divider circuit and a voltage follower circuit. The buffer circuit is configured to output a second voltage according to a first voltage. The voltage divider circuit is coupled to the buffer circuit, and configured to implement a voltage division function to provide a third voltage according to the second voltage and a pad voltage on the pad of the integrated circuit. The voltage follower circuit is coupled to the voltage divider circuit, and configured to generate the bias voltage according to the third voltage.

According to some embodiments of the present invention, the dynamic bias voltage circuit further comprises a voltage generating circuit, coupled to the buffer circuit, configured to generate the first voltage by dividing a power supply voltage through a resistor network. Additionally, the resistor network comprises a first resistor and a second resistor connected in series.

According to some embodiments of the present invention, wherein the voltage divider circuit comprises a third resistor and a fourth resistor connected in series, wherein the third voltage is generated at a node between the third resistor and the fourth resistor.

According to some embodiments of the present invention, the resistance relationship between the third resistor and the fourth resistor is associated with a voltage variation range of the pad voltage and a maximum withstand voltage imposed by specific manufacturing process of the integrated circuit.

According to some embodiments of the present invention, the voltage follower circuit comprises a first transistor, a second transistor and a third transistor. The first transistor has a control end, a first end and a second end, wherein the control end of the first transistor is coupled to a first fixed voltage, the first end of the first transistor is coupled to a power supply voltage. The second transistor has a control end, a first end and a second end, wherein the control end of the second transistor is coupled to the third voltage, the first end of the second transistor is coupled to the second end of the first transistor, the node between the first transistor and the second transistor serves as an output terminal of the voltage follower circuit. The third transistor has a control end, a first end and a second end, wherein the control end of the third transistor is coupled to a second fixed voltage, the first end of the third is coupled to the second end of the second transistor, and the second end of the third transistor is coupled to the ground.

According to some embodiments of the present invention, the dynamic bias voltage circuit further comprises a current mirror circuit, configured to provide an operating current for the voltage follower circuit. Additionally, the integrated circuit comprises a normal operating mode and a power-saving mode; during the normal operating mode, the operating current has a first current value, and during the power-saving mode, the operating current has a second current value which is less than the first current value.

According to some embodiments of the present invention, the integrated circuit is compliant with Universal Serial Bus (USB) standard, the at least one specific transistor of the output stage circuit is at least one of first transistors seen from or directly connected to the pad of the integrated circuit, and the bias voltage is coupled to a control end of the at least one specific transistor.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1:
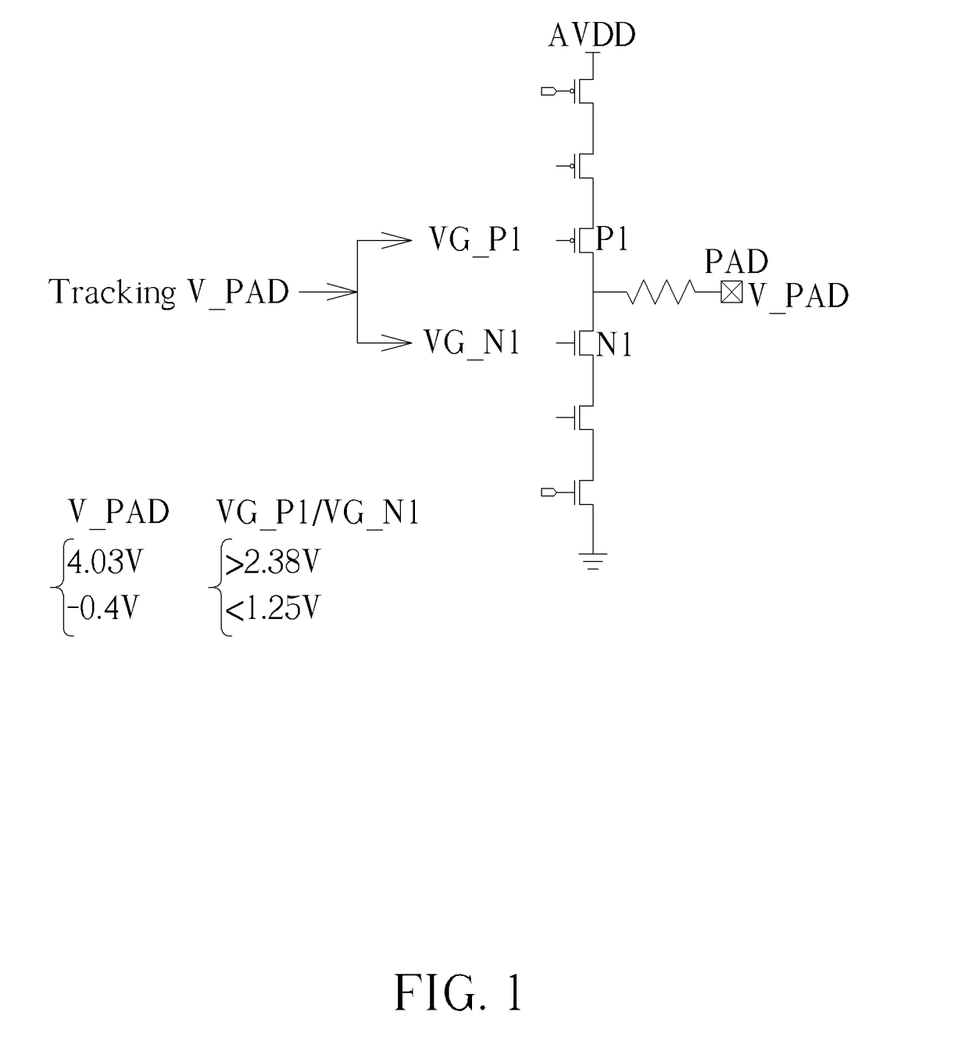
FIG. 1 illustrates a simplified schematic diagram of an output stage circuit of USB IC.

The following description is made for the purpose of illustrating the general principles of the invention and should not be taken in a limiting sense. The scope of the invention is best determined by reference to the appended claims. FIG. 1 illustrates a simplified schematic diagram of one output stage circuit of IC (e.g. USB IC) of the present invention, wherein the output stage circuit is configured to communicate signals to structures external to the integrated circuit, please note that FIG. 1 is only an example and not a limitation of the present invention. Specifically, taking a voltage variation range on the pad (e.g., signal pad of the IC, which is used to connect to the external structure of the IC, specifically, such as I/O pad) is −0.4V~4.03V, and a maximum withstand voltage for the gate-to-drain junction of the MOS transistors within the IC under the specific manufacturing process (e.g. 3 nm process) is 1.65V as an example. In the case of the application of USB, but the invention is not limited to this, the pad can be the signal pads PAD_DP and/or PAD_DM, wherein the signal pad PAD_DP is used for USB Data Positive (DP) signal, and the signal pad PAD_DM is used for USB Data Minus (DM) signal. As shown in the diagram, when a voltage on a pad PAD of an IC (not shown) is at 4.03V (i.e., an upper bound of the voltage variation range on the pad), gate voltages VG_P1 and VG_N1 of transistors P1 and N1 (both of which are first transistors seen from (or directly connected to) the pad PAD) need to be greater than 2.38V, such that the requirement of the absolute value of gate-to-drain voltage |VGD| of the MOS transistors directly connected to the pad PAD being lower than 1.65V (i.e., the maximum withstand voltage for the gate-to-drain junction under the specific/given/certain manufacturing process) can be satisfied. On the other hand, when a voltage on a pad PAD of the IC is at −0.4V (i.e., a lower bound of the voltage variation range on the pad), the gate voltages VG_P1 and VG_N1 of MOS transistors P1 and N1 need to be lower than 1.25V, such that the requirement of the absolute value of gate-to-drain voltage |VGD| of the MOS transistors directly connected to the pad PAD being lower than 1.65V can be satisfied. In view of this, the present invention provides a dynamic bias voltage circuit to generate a dynamic bias voltage as gate voltages of first transistors seen from or directly connected to the pad of the IC, such that the gate voltages of first transistors seen from or directly connected to the pad PAD are able to dynamically track voltage variations on the pad of the IC.

Figure 2:
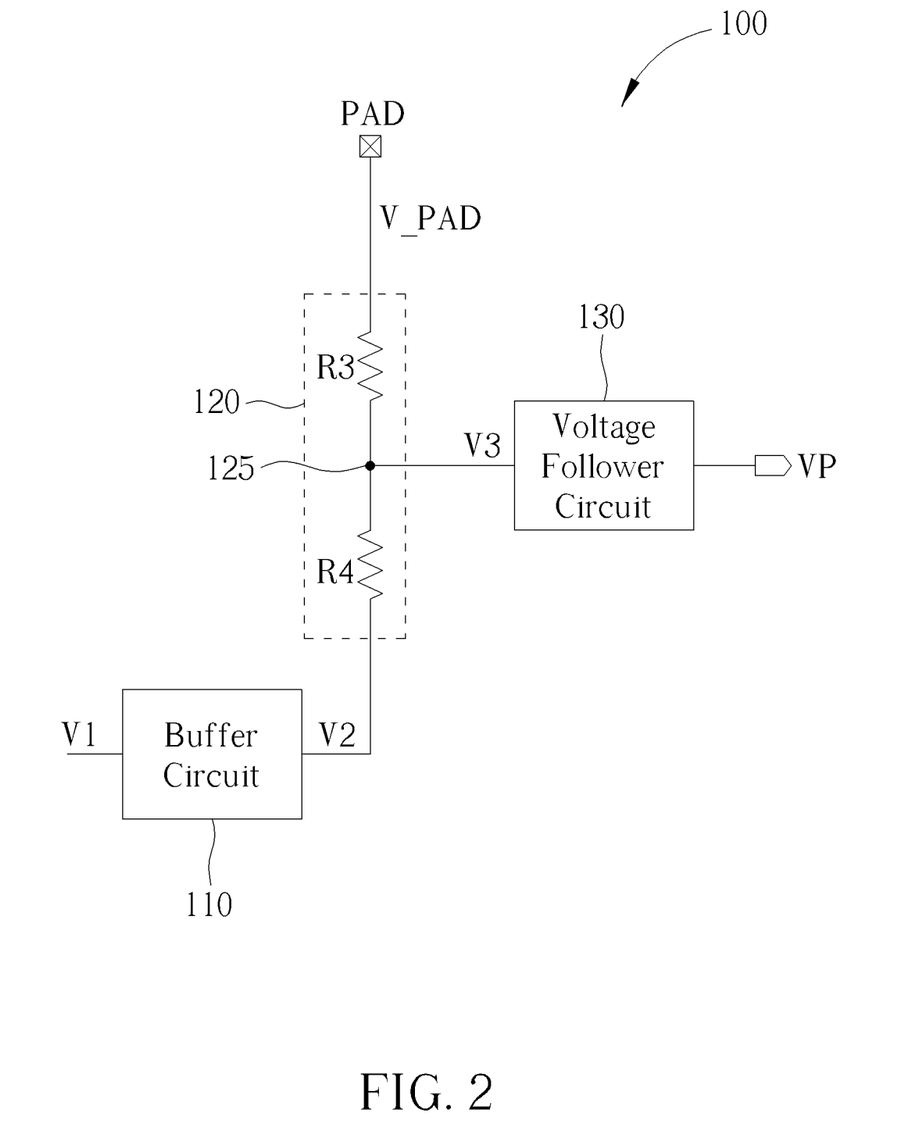
FIG. 2 illustrates a simplified schematic diagram of a dynamic bias voltage circuit according to one embodiment of the present invention.

FIG. 2 illustrates a simplified schematic diagram of a dynamic bias voltage circuit according to one embodiment. In one embodiment, the dynamic bias voltage circuit of the present invention can be used to provide bias voltage for specific transistors of an output stage of an integrated circuit. In one embodiment, an integrated circuit may comprise an output stage circuit and a dynamic bias voltage circuit of the present invention. As depicted in FIG. 2, a dynamic bias voltage circuit 100 comprises a buffer circuit 110, a voltage divider circuit 120 and a voltage follower circuit 130. The buffer circuit 110 has the characteristics of high input impedance and low output impedance, and the buffer circuit 110 is configured to provide a second voltage V2 according to a first voltage V1 (i.e., a reference voltage), where V2=F1*V1 (F1 being a conversion factor and typically lower than or equal to 1). By using buffer circuit 110, the voltage V2 outputted by the buffer circuit 110 has a high driving capability and may be not affected by the following circuits/voltages (e.g., V_PAD).

Figure 3A:
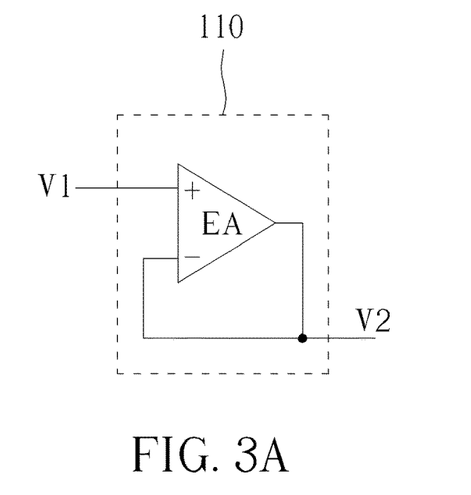
FIG. 3A and FIG. 3B illustrate possible implementations of the buffer circuit of FIG. 2 according to various embodiments of the present invention.
Figure 3B:
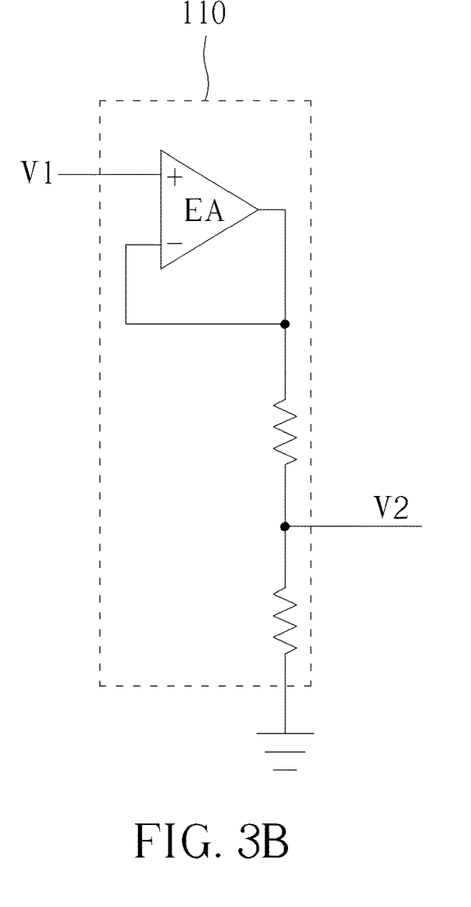

FIG. 3A and FIG. 3B illustrates possible implementations of the buffer circuit 110 according to various embodiments of the present invention. In the shown implementations, the buffer circuit 110 could take the form of a unity gain buffer or a combination of a unity gain buffer and a voltage divider circuit. However, the scope of the present invention is not limited to these designs. In various embodiments of the present invention, the buffer circuit 110 could be any other type of circuitry that is based on a buffer. Preferably, the buffer or the unity gain buffer could be implemented using an amplifier (e.g., error amplifier) in a negative feedback configuration. As shown in FIG. 3A and FIG. 3B, the buffer circuit may comprise an error amplifier (EA) having a first input terminal (positive input terminal), a second input terminal (negative input terminal) and an output terminal, wherein the first input terminal receives the first voltage, and the second input terminal is coupled to the output terminal. Specifically, in one embodiment as shown in FIG. 3A, the output terminal of the amplifier outputs the second voltage and the second voltage may equal to the first voltage. In another embodiment as shown in FIG. 3B, the second voltage is generated based on the output voltage of the amplifier and the second voltage is less or lower than the first voltage.

Referring back to FIG. 2, the voltage divider circuit 120, coupled to an output of the buffer circuit 110, is configured to implement a voltage division function to provide a third voltage V3 according to a pad voltage V_PAD on a pad (PAD) and the second voltage V2 outputted by the buffer circuit 110. In this embodiment, the voltage divider circuit 120 may be equivalent to include resistors R3 and R4 that are connected in series. The pad voltage V_PAD is coupled to one end of the resistor R3, the second voltage V2 is coupled to one end of the resistor R4, and the third voltage V3 is generated at a node 125 between resistors R3 and R4. However, in various embodiments of the present invention, the voltage divider circuit 120 may include other types of resistor networks, which have more resistors or components in addition to resistors R3 and R4.

As shown in FIG. 2, the third voltage V3 can be expressed as follows:

$$V3 = V2 + \frac{R4}{R3+R4} * (V\_PAD - V2) = V1 + \frac{R4}{R3+R4} * (V\_PAD - V1)$$

in case of $$V2 = V1$$

In view of above, it can be understood that the third voltage V3 can track voltage variations of the pad voltage V_PAD. Please note that a driving capability at the node 125 (which outputs the third voltage V3) of the voltage divider circuit 120 is pretty weak. Hence, the dynamic bias voltage circuit 100 may further include the voltage follower circuit 130 to enhance the driving capability.

Figure 4:
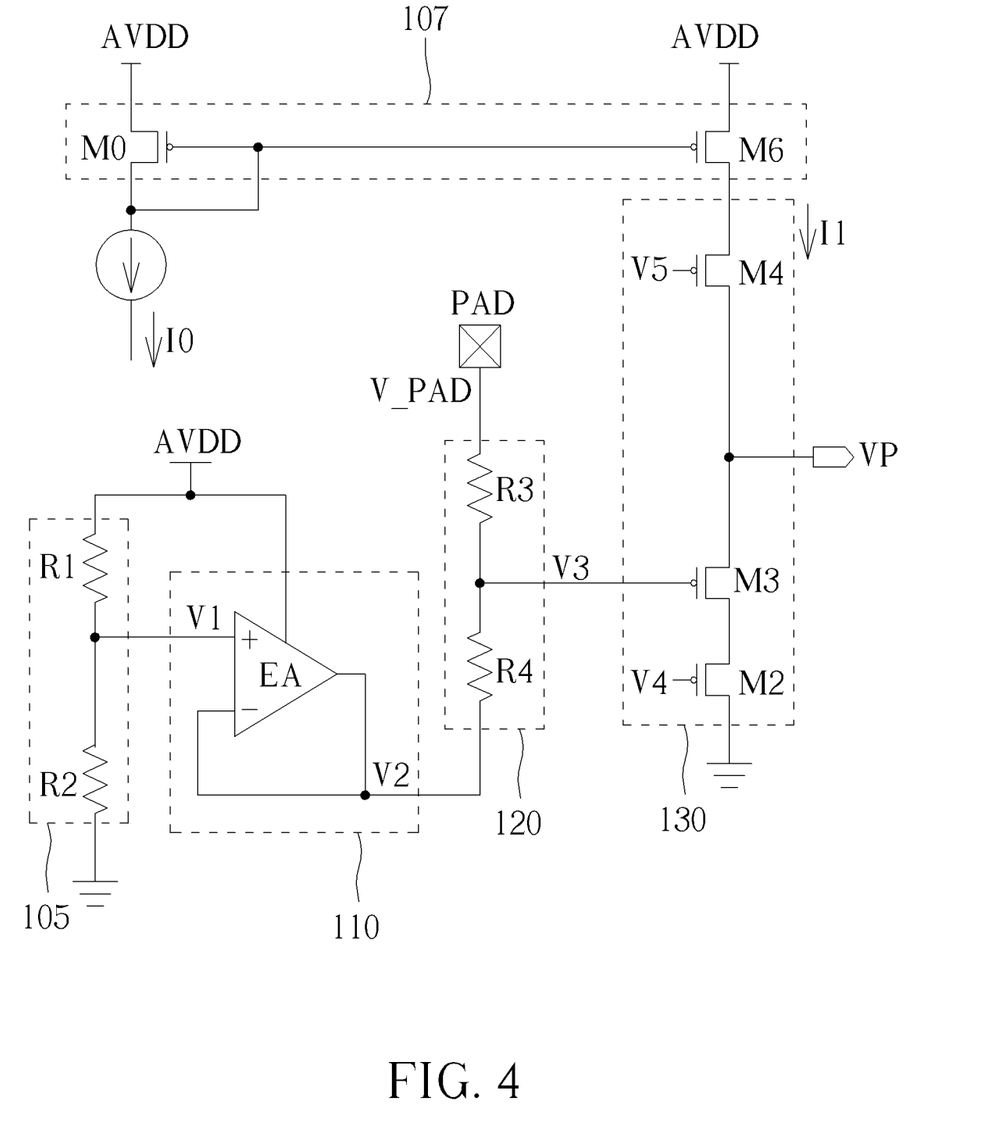
FIG. 4 illustrates a detailed schematic diagram of a dynamic bias voltage circuit according to one embodiment of the present invention.

FIG. 4 illustrates a detailed schematic diagram of the dynamic bias voltage circuit according to one embodiment of the present invention. As depicted in FIG. 4, the dynamic bias voltage circuit 100 may further include a voltage generating circuit 105, and the buffer circuit 110 is further coupled to a voltage generating circuit 105. The voltage generating circuit 105 is configured to provide or generate the first voltage V1. For example, the voltage generating circuit 105 may be equivalent to include resistors R1 and R2 that are connected in series, and the first voltage V1 is generated by dividing a power supply voltage AVDD (e.g. 3.3V) through resistors R1 and R2. Please note that, according to various embodiments of the present invention, the voltage generating circuit 105 may include other types of resistor networks, which have more resistors or components in addition to resistors R1 and R2, to meet different design requirements. Moreover, in various embodiments of the present invention, the voltage generating circuit 105 can be implemented by a bandgap reference circuit (i.e., bandgap reference voltage generator).

On the other hand, the voltage follower circuit 130 is configured to generate a bias voltage VP according to the third voltage V3 provided by the voltage divider circuit 120. Please note that the voltage follower circuit 130 is characterized by very high input impedance and can be used to isolate input and output signals, thus the bias voltage VP may be not affected by the following circuits/voltages. The generated bias voltage VP can be applied to gates of the first transistors seen from or directly connected to an IC pad. Taking circuitry of FIG. 1 as an example, if the pad PAD of FIG. 4 is the pad PAD of FIG. 1, the generated bias voltage VP can be applied to gates of transistors P1 and N1.

In this embodiment, the voltage follower circuit 130 may include a source follower, which can be implemented by the transistor M3 as shown in FIG. 4. In addition, the voltage follower circuit 130 may further comprise transistors M2 and M4. The third voltage V3 is coupled to a control end (e.g., gate) of the transistor M3, and the bias voltage VP is output from an output terminal of the dynamic bias voltage circuit 100 that is between the transistors M3 and M4. Additionally, control ends of the transistors M2 and M4 are coupled to fixed bias voltages V4 and V5, respectively. Please note that, the number of transistors included in the voltage follower circuit 130 is not a limitation of the present invention. Actually, the number of MOS transistors included in the voltage follower circuit 130 is associated with a level of the power supply voltage AVDD. In the case where the power supply voltage AVDD is 3.3V, and the maximum withstand voltage for the gate-to-drain junctions of the MOS transistors is 1.65V, the arrangement and the number of the MOS transistors in the voltage follower circuit 130 could be identical to that shown in FIG. 4. However, in various embodiments of the present invention, there could be more or fewer MOS transistors included in the voltage follower circuit 130. In one embodiment, the transistors M2, M3 and M4 are P-channel Metal Oxide Semiconductor (PMOS) transistors.

As shown in FIG. 4, the dynamic bias voltage circuit may further include a current mirror circuit 107, which is configured to generate an operating current I1 for the voltage follower circuit 130. For example, the current mirror circuit 107 may comprise at least one current mirror which may include transistors M0 and M6 shown in FIG. 4. Specifically, the current mirror circuit 107 mirrors a reference current I0 to generate the operating current I1. Moreover, in various embodiments of the present invention, the current mirror circuit 107 may have more current mirrors, for example, enabling the generation of the reference current I0 by mirroring another reference current, thus, a large current can be obtained from a small current. It should be noted that the generation an operating current I1 is not limited to a current mirror circuit.

In the embodiment shown by FIG. 4, the voltage generating circuit 105 generates the first voltage V1 (i.e., reference voltage) by dividing the power supply voltage AVDD using the resistors R1 and R2. Thus, in the case of the buffer circuit 110 is a unity gain buffer, the first voltage V1 and the second voltage V2 can be expressed as follows:

$$V2 = V1 = \frac{R2}{R1+R2} * AVDD$$

Hence, in the embodiments as depicted in FIG. 2 and FIG. 4, the third voltage V3 provided by the voltage divider circuit 120 can be expressed as follows:

$$V3 = V2 + \frac{R4}{R3+R4} * (V\_PAD - V2) =$$

$$\frac{R3}{R3+R4} * \frac{R2}{R1+R2} * AVDD + \frac{R4}{R3+R4} * V\_PAD$$

Further, the bias voltage VP generated by the voltage follower circuit 130 can be expressed as:

$$VP =$$
$$V3 + VSG_{M3} = \frac{R4}{R3+R4} * V\_PAD + \frac{R3}{R3+R4} * \frac{R2}{R1+R2} * AVDD + VSG_{M3}$$

Here, the voltage $VSG_{M3}$ is a source-to-gate voltage of the transistor M3, which is equal to $VS_{M3} - VG_{M3}$, wherein $VS_{M3}$ is a source voltage of the transistor M3 and $VG_{M3}$ is a gate voltage of the transistor M3. In addition, a relationship between the source-to-gate voltage $VSG_{M3}$ of the transistor M3 and the operating current I1 is as follows:

$$VSG_{M3} \propto \sqrt{\frac{I1}{K}}$$

Here, K is a constant, for example, which is associated with the size of the transistor M3 in the voltage follower circuit 130 under the given manufacturing process. Hence, for a specific magnitude of the operating current I1, the source-to-gate voltage $VSG_{M3}$ would be known. For example, the source-to-gate voltage $VSG_{M3}$ actually can be determined based on the magnitude of the operating current I1 and the size of the transistor M3 under the specific or given manufacturing process. For illustrative purposes, the source-to-gate voltage $VSG_{M3}$ is usually in the range of several hundred millivolts (e.g., 400-500 mV).

As can be comprehended from the expression of the bias voltage VP, the bias voltage VP equals a summation of the third voltage V3 (which is associated with the pad voltage V_PAD) and a fixed voltage (which is $VSG_{M3}$). In view of this, the dynamic bias voltage circuit 100 is capable of dynamically tracking the pad voltage V_PAD.

Moreover, assume that the voltage variation range of the pad voltage V_PAD varies from a to b, a first preset value of the bias voltage VP is represented as "Va" at the condition of V_PAD=a (the lower bound of the voltage variation range) and a second preset value of the bias voltage VP is represented as "Vb" at the condition of V_PAD=b (the upper bound of the voltage variation range), the above-mentioned expression of the bias voltage VP can be rewritten as follows:

$$\frac{R4}{R3+R4} * b + \frac{R3}{R3+R4} * \frac{R2}{R1+R2} * AVDD + VSG_{M3} = Vb$$

$$\frac{R4}{R3+R4} * a + \frac{R3}{R3+R4} * \frac{R2}{R1+R2} * AVDD + VSG_{M3} = Va$$

Further, the above equations can be converted into:

$$\frac{R4}{R3+R4} = \frac{Vb-Va}{b-a}$$

$$\frac{R2}{R1+R2} = \frac{b*Va - a*Vb - VSG_{M3}*(b-a)}{(Va-Vb+b-a)*AVDD}$$

In view of above, through the voltage variation range of the pad voltage V_PAD, the values a and b can be determined. Moreover, through the maximum withstand voltage V_W for gate-to-drain junction imposed by the manufacturing process, the preset values Va and Vb can be obtained or determined according to the requirement of |VGD|<V_W, that is to say, "Va−a<V_W" as well as "b−Vb<V_W", hence, "Va<a+V_W" and "Vb>b−V_W". Please note that, the preset values Va and Vb are associated with (or limited by) the voltage variation range and the maximum withstand voltage V_W. Further, a resistance relationship between resistors R3 and R4 can be further expressed as follows:

$$\frac{R3}{R4} = \frac{b - Vb - (a - Va)}{Vb - Va}$$

In view of above, the resistance relationship between the resistors R3 and R4 can be obtained or determined according to the upper bound b and the lower bound a of the voltage variation range of the pad voltage V_PAD, as well as the maximum withstand voltage V_W, wherein the preset values of the bias voltages VP (i.e., Va and Vb) are associated with the voltage variation range and the maximum withstand voltage V_W. Moreover, the resistance relationship between the resistors R1 and R2 could also be obtained or determined at least according to the voltage variation range of the pad voltage V_PAD and the maximum withstand voltage V_W, for example, according to values a, b, Va and Vb (which are associated with the voltage variation range and the maximum withstand voltage V_W), as well as the power supply voltage AVDD and the source-to-gate voltage $VSG_{M3}$ of the transistor M3.

As mentioned above, the bias voltage VP provided by the dynamic bias voltage circuit 100 will be applied to the gate of the first transistor seen from (or directly connected to) the pad PAD (e.g., I/O pad). Hence, when the pad voltage V_PAD is at lower bound a, the gate-to-drain voltage |VGD| of the first MOS transistor seen from the pad PAD would be "Va−a", which needs to be smaller than the maximum withstand voltage V_W for the gate-to-drain junction. In other words, the preset value Va of the bias voltage VP can be any suitable value lower than "a+V_W". On the other hand, when the pad voltage V_PAD is at the upper bound b, the gate-to-drain voltage |VGD| of the first MOS transistor seen from the pad PAD would be "b−Vb", which needs to be smaller than the maximum withstand voltage V_W for the gate-to-drain junction. In other words, the value Vb of the bias voltage VP can be any suitable value greater than "b−V_W". Assume that the pad voltage V_PAD varies from −0.4V to 4.03V, and the maximum withstand voltage V_W for the gate-to-drain junction is 1.65V, the value Va of the bias voltage VP could be any suitable value smaller than 1.25V, and the value Vb of the bias voltage VP could be any suitable value greater than 2.38. Also, value Vb of the bias voltage VP needs to be smaller than the power supply voltage AVDD (e.g., 3.3V).

In one embodiment, the driving capability of the dynamic bias voltage circuit 100 can be adjusted by varying the magnitude of operating current I1. For example, suppose a size ratio of the transistor M0 to the transistor M6 is 1:n, then the ratio of the magnitude of the reference current I0 to that of the operating current I1 will be 1:n. Thus, adjusting the magnitude of the reference current I0 is equivalent to proportionally adjusting the magnitude of the operating current I1. Therefore, enlarging the magnitude of the reference current I0 is equivalent to enhancing the driving capability of the voltage follower circuit 130, because the greater the operating current I1, the stronger the driving ability of the voltage follower circuit 130. Also, since the magnitude of the operating current I1 and the source-to-gate voltage of the transistor M3 $VSG_{M3}$ have an exponential relationship, the influence of the magnitude of the operating current I1 on the outputted bias voltage VP is relatively small. Thus, a certain voltage margin can be reserved when the preset Va and Vb are set.

In one embodiment, the integrated circuit may comprise a normal operating mode and a power-saving mode. During the normal operating mode, the operating current I1 has a first current value, and during the power-saving mode, the operating current I1 has a second current value which is less than the first current value. Specifically, in the application for USB 2.0, the normal operating mode refers to a full-speed transmission (FSTX) mode, when the USB IC is operated in the FSTX mode, the operating current I1 for the voltage follower circuit 130 needs to be higher to enhance the driving ability, thereby to avoid being interfered by the signal on the pad PAD (which may affect the performance of the dynamic bias voltage circuit 100) and have high driving capability. However, when the USB IC is operated in a power-saving mode, almost circuits in USB IC may stop operating, but the dynamic bias voltage circuit 100 still needs to operate. Hence, the operating current I1 could be lower for reducing power consumption. Therefore, in some embodiments, different values of the operating current I1 can be set in advance for different operating modes. For example, the first current value can be set for the FSTX mode, and the second current value can be set for the power-saving mode, where the first current value is larger than the second current value.

Please note that while the USB 2.0 related voltage variation range (e.g., −0.4V to 4.03V) and the maximum withstand voltage (e.g., 1.65V) of specific manufacturing process have been extensively mentioned to explain the concept of the present invention, it is not intended to limit the present invention in scope. The dynamic bias voltage circuit 100 of the present invention can be used with ICs other than USB ICs, thereby ensuring that the gate-to-drain voltage |VGD| of the first transistor seen from IC pads (e.g., I/O pad) will not exceed the maximum withstand voltage imposed by specific manufacturing process of the IC. Therefore, the present invention effectively ensures the reliability requirement of MOS transistors under specific manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic bias voltage circuit for providing a dynamic bias voltage to at least one specific transistor of an integrated circuit, comprising:
   a buffer circuit, configured to output a second voltage according to a first voltage;
   a voltage divider circuit, coupled to the buffer circuit, configured to implement a voltage division function to provide a third voltage according to the second voltage and a pad voltage on a pad of the integrated circuit; and
   a voltage follower circuit, coupled to the voltage divider circuit, configured to generate the bias voltage according to the third voltage;
   wherein the at least one specific transistor to which the bias voltage is provided is at least one of first transistors seen from or directly connected to the pad of the integrated circuit and the bias voltage is coupled to a control end of the at least one specific transistor.

2. The dynamic bias voltage circuit of claim 1, wherein the buffer circuit comprises
   an amplifier having a first input terminal, a second input terminal and an output terminal, wherein the first input terminal receives the first voltage, and the second input terminal is coupled to the output terminal;
   wherein the output terminal of the amplifier outputs the second voltage, and the second voltage equals the first voltage; or
   wherein the second voltage is generated based on the output voltage of the amplifier and the second voltage is less than the first voltage.

3. The dynamic bias voltage circuit of claim 1, further comprising:
a voltage generating circuit, coupled to the buffer circuit, configured to generate the first voltage by dividing a power supply voltage through a resistor network;
wherein the resistor network comprises a first resistor and a second resistor connected in series.

4. The dynamic bias voltage circuit of claim 1, wherein the voltage divider circuit comprises:
a third resistor and a fourth resistor connected in series, wherein the third voltage is generated at a node between the third resistor and the fourth resistor.

5. The dynamic bias voltage circuit of claim 4, wherein a first end of the third resistor is coupled to the pad voltage, a second end of the third resistor is coupled to a first end of the fourth resistor, and a second end of the fourth resistor is coupled to the second voltage.

6. The dynamic bias voltage circuit of claim 5, wherein the resistance relationship between the third resistor and the fourth resistor is associated with a voltage variation range of the pad voltage and a maximum withstand voltage imposed by specific manufacturing process of the integrated circuit.

7. The dynamic bias voltage circuit of claim 1, wherein the voltage follower circuit comprises:
a first transistor, having a control end, a first end and a second end, wherein the control end of the first transistor is coupled to a first fixed voltage, the first end of the first transistor is coupled to a power supply voltage;
a second transistor, having a control end, a first end and a second end, wherein the control end of the second transistor is coupled to the third voltage, the first end of the second transistor is coupled to the second end of the first transistor, the node between the first transistor and the second transistor serves as an output terminal of the voltage follower circuit; and
a third transistor, having a control end, a first end and a second end, wherein the control end of the third transistor is coupled to a second fixed voltage, the first end of the third transistor is coupled to the second end of the second transistor, and the second end of the third transistor is coupled to the ground.

8. The dynamic bias voltage circuit of claim 1, wherein the voltage follower circuit comprises a source follower, which is implemented by a transistor.

9. The dynamic bias voltage circuit of claim 1, further comprising:
a current mirror circuit, configured to provide an operating current for the voltage follower circuit.

10. The dynamic bias voltage circuit of claim 9, wherein the bias voltage is associated with the pad voltage and the operating current.

11. The dynamic bias voltage circuit of claim 1, wherein the integrated circuit comprises a normal operating mode and a power-saving mode; during the normal operating mode, the operating current has a first current value, and during the power-saving mode, the operating current has a second current value which is less than the first current value.

12. The dynamic bias voltage circuit of claim 1, wherein the integrated circuit is compliant with Universal Serial Bus (USB) standard, and the integrated circuit comprises a full-speed transmission (FSTX) mode and a power-saving mode, during the FSTX mode, the operating current that is provided to the voltage follower circuit has a first current value, and during the power-saving mode, the operating current has a second current value which is less than the first current value.

13. An integrated circuit, comprising:
an output stage circuit, configured to communicate signals to structures external to the integrated circuit; and
a dynamic bias voltage circuit, configured to provide a dynamic bias voltage to at least one specific transistor of the output stage circuit, wherein the dynamic bias voltage circuit comprises:
a buffer circuit, configured to output a second voltage according to a first voltage;
a voltage divider circuit, coupled to the buffer circuit, configured to implement a voltage division function to provide a third voltage according to the second voltage and a pad voltage on a pad of the integrated circuit; and
a voltage follower circuit, coupled to the voltage divider circuit, configured to generate the bias voltage according to the third voltage;
wherein the at least one specific transistor to which the bias voltage is provided is at least one of first transistors seen from or directly connected to the pad of the integrated circuit and the bias voltage is coupled to a control end of the at least one specific transistor.

14. The integrated circuit of claim 13, wherein the dynamic bias voltage circuit further comprises:
a voltage generating circuit, coupled to the buffer circuit, configured to generate the first voltage by dividing a power supply voltage through a resistor network;
wherein the resistor network comprises a first resistor and a second resistor connected in series.

15. The integrated circuit of claim 13, wherein the voltage divider circuit comprises:
a third resistor and a fourth resistor connected in series, wherein the third voltage is generated at a node between the third resistor and the fourth resistor.

16. The integrated circuit of claim 15, wherein the resistance relationship between the third resistor and the fourth resistor is associated with a voltage variation range of the pad voltage and a maximum withstand voltage imposed by specific manufacturing process of the integrated circuit.

17. The integrated circuit of claim 13, wherein the voltage follower circuit comprises:
a first transistor, having a control end, a first end and a second end, wherein the control end of the first transistor is coupled to a first fixed voltage, the first end of the first transistor is coupled to a power supply voltage;
a second transistor, having a control end, a first end and a second end, wherein the control end of the second transistor is coupled to the third voltage, the first end of the second transistor is coupled to the second end of the first transistor, the node between the first transistor and the second transistor serves as an output terminal of the voltage follower circuit; and
a third transistor, having a control end, a first end and a second end, wherein the control end of the third transistor is coupled to a second fixed voltage, the first end of the third is coupled to the second end of the second transistor, and the second end of the third transistor is coupled to the ground.

18. The integrated circuit of claim 13, wherein the dynamic bias voltage circuit further comprises:
a current mirror circuit, configured to provide an operating current for the voltage follower circuit;
wherein the integrated circuit comprises a normal operating mode and a power-saving mode; during the normal operating mode, the operating current has a first current value, and during the power-saving mode, the operating current has a second current value which is less than the first current value.

19. The integrated circuit of claim 13, wherein the integrated circuit is compliant with Universal Serial Bus (USB) standard, the at least one specific transistor of the output stage circuit is at least one of first transistors seen from or directly connected to the pad of the integrated circuit, and the bias voltage is coupled to a control end of the at least one specific transistor.

20. A dynamic bias voltage circuit for providing a dynamic bias voltage to at least one specific transistor of an integrated circuit, comprising:
- a buffer circuit, configured to output a second voltage according to a first voltage;
- a voltage divider circuit, coupled to the buffer circuit, configured to implement a voltage division function to provide a third voltage according to the second voltage and a pad voltage on a pad of the integrated circuit; and
- a voltage follower circuit, coupled to the voltage divider circuit, configured to generate the bias voltage according to the third voltage;
- wherein the integrated circuit comprises a normal operating mode and a power-saving mode; during the normal operating mode, an operating current that is provided to the voltage follower circuit has a first current value, and during the power-saving mode, the operating current has a second current value which is less than the first current value.

* * * * *